United States Patent
Ono et al.

(10) Patent No.: US 7,307,438 B2
(45) Date of Patent: Dec. 11, 2007

(54) THERMAL TRANSFERRING MEMBER, TEST BOARD AND TEST APPARATUS

(75) Inventors: Atsushi Ono, Tokyo (JP); Koei Nishiura, Tokyo (JP); Satoshi Hanamura, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/217,128

(22) Filed: Aug. 31, 2005

(65) Prior Publication Data
US 2006/0192580 A1 Aug. 31, 2006

(30) Foreign Application Priority Data
Feb. 25, 2005 (JP) .............................. 2005-051428

(51) Int. Cl.
*G01R 31/02* (2006.01)
(52) U.S. Cl. ....................................... 324/760; 165/185
(58) Field of Classification Search ...................... None
See application file for complete search history.

(56) References Cited

U.S. PATENT DOCUMENTS

| | | | |
|---|---|---|---|
| 6,073,684 A * | 6/2000 | Fiechter et al. ........ | 165/104.33 |
| 6,257,328 B1 * | 7/2001 | Fujiwara et al. ............ | 165/185 |
| 6,703,561 B1 * | 3/2004 | Rosenberg et al. ......... | 174/541 |
| 6,758,264 B2 * | 7/2004 | Azuma ....................... | 165/185 |
| 6,822,875 B2 * | 11/2004 | Chan et al. .................. | 361/760 |
| 6,940,723 B2 * | 9/2005 | Ice et al. ..................... | 361/709 |

* cited by examiner

*Primary Examiner*—Minh N. Tang
(74) *Attorney, Agent, or Firm*—Osha Liang LLP

(57) ABSTRACT

There is provided a heat transferring object for transferring heat generated by a object to be cooled to a cooling unit, having a plurality of thermal transferring plates each having elasticity and provided in lamination and adhesive materials having thermal conductivity and provided between the thermal transferring plates so as to slidably hold the thermal transferring plates. Preferably, each of the thermal transferring plates has almost the same shape. Each of the thermal transferring plates may have a cooling unit fixing portion to be secured to the cooling unit and a plurality of extensions extending respectively from the cooling unit fixing portion and secured to the objects to be cooled independently from each other.

9 Claims, 6 Drawing Sheets

THERMAL TRANSFERRING MEMBER, TEST BOARD AND TEST APPARATUS

CROSS REFERENCE TO RELATED APPLICATION

The present application claims priority from a Japanese Patent Application No. 2005-051428 filed on Feb. 25, 2005, the contents of which are incorporated herein by reference.

BACKGROUND OF THE INVENTION

1. Field of the Invention

The present relates to a heat transferring object for transferring heat generated by a object to be cooled to a cooling unit as well as to a test board and a test apparatus using the heat transferring object.

2. Related Art

Conventionally, as a heat transferring object for cooling a object to be cooled by transferring heat generated by the object to be cooled to a cooling unit, there has been one using a metal having high thermal conductivity. The object to be cooled is cooled by thermally connecting the object to be cooled and the cooling unit by using the heat transferring object so as to cause heat exchange between the object to be cooled and the cooling unit.

For example, in a test apparatus for testing an electronic device such as a semiconductor circuit, a circuit section of a test board for outputting signals to be fed to the electronic device often gets high temperature because the test board uses a large number of integrated circuits. Then a cooling unit is provided so as to cover the circuit section to cool the circuit section by means of water cooling or the like in the conventional test apparatus.

The test board is connected with a test head for mounting the electronic devices through an intermediary of cables. The test board is connected with the cables through an intermediary of connectors. Therefore, the connector on the test board side must be exposed to the outside of an area covered by the cooling unit.

It is noted that the present applicant is presently unaware of any related patent document, so that its description will be omitted here.

It is conceivable of connecting the test board with the test head by optical cables in transmitting/receiving signals between the test board and the test head at high speed. In such a case, optical connectors are provided in the test board.

The optical connector generates heat because it has a light receiving element, a photoelectric transfer element, a light emitting element or the like. However, the optical connector must be exposed to the outside of the area covered by the cooling unit as described before. Therefore, it cannot be cooled directly by the cooling unit.

In order to cool the object separated from the cooling unit as described above, it has been known to thermally connect the cooling unit with the object to be cooled by using the heat transferring object described above. However, when there is a difference in positional level between the cooling unit and the optical connector, the connection among the cooling unit, the optical connector and the heat transferring object becomes a point-to-point contact and cooling efficiency drops because the conventional heat transferring object is rigid. Still more, the point connecting the cooling unit with the heat transferring object is stressed in such a case.

While the heat transferring object is secured to the cooling unit and the optical connector by screws or the like, the object to be cooled such as a semiconductor circuit is soldered to a board such as a printed board. When the point connecting the cooling unit with the heat transferring object is stressed in such a state, there arises a problem that the soldered part is stressed, thus degrading reliability on the connection.

SUMMARY OF THE INVENTION

Accordingly, it is an object of the invention to provide a heat transferring object, a test board and a test apparatus that are capable of solving the above-mentioned problems. This object may be achieved through the combination of features described in independent claims of the invention. Dependent claims thereof specify preferable embodiments of the invention.

In order to solve the above-mentioned problems, according to a first aspect of the invention, there is provided a heat transferring object for transferring heat generated by a object to be cooled to a cooling unit, having a plurality of thermal transferring plates each having elasticity and provided in lamination and adhesive materials having thermal conductivity and provided between the thermal transferring plates so as to slidably hold the thermal transferring plates.

Preferably, each of the thermal transferring plates has almost the same shape. Each of the thermal transferring plates may have a cooling unit fixing portion to be secured to the cooling unit and a plurality of extensions extending respectively from the cooling unit fixing portion and secured to the objects to be cooled independently from each other.

According to a second aspect of the invention, there is provided a test apparatus for testing an electronic device, having a plurality of circuit sections to be driven to test the electronic device, cables for connecting one of the circuit sections with the other one of the circuit sections, connector sections for connecting each of the circuit sections with the cable, a cooling unit for cooling at least a part of the plurality of circuit sections and a heat transferring object for thermally connecting the cooling unit with the connector section provided in correspondence to the circuit section to be cooled by the cooling unit, wherein the heat transferring object has a plurality of thermal transferring plates each having elasticity and provided in lamination and adhesive materials having thermal conductivity and provided between the thermal transferring plates so as to slidably hold the thermal transferring plates.

According to a third aspect of the invention, there is provided a test apparatus for testing an electronic device, having a test head for transmitting/receiving signals to/from the electronic device, a test board for generating and feeding a test signal to be fed to the electronic device and cables for connecting the test head with the test board, wherein the test board has a circuit section for generating the test signal, a cooling unit for cooling the circuit section, a connector section for transmitting/receiving signals between the circuit section and the cables and a heat transferring object for thermally connecting the cooling unit with the connector section, and the heat transferring object has a plurality of thermal transferring plates each having elasticity and provided in lamination and adhesive materials having thermal conductivity and provided between the thermal transferring plates to slidably fix the thermal transferring plates.

The cable may be an optical cable for optically connecting the test head with the test board, the cooling unit may cover and cool the circuit section by means of cooling fluid circulating therein, the connector section may be provided on the outside of an area covered by the cooling unit and may optically connect the circuit section with the cable and the heat transferring object may thermally connect the cooling unit with the connector section.

Each of the thermal transferring plates may have almost the same shape. Each thermal transferring plate may have a cooling unit fixing portion to be secured to the cooling unit and a plurality of extensions extended respectively from the cooling unit fixing portion to be secured to the connector sections independently from each other. The connector section may have a plurality of optical connectors connected to the cables and a plurality of transmission modules, receiving modules or transmission/receiving modules for transmitting/receiving signals between the plurality of optical connectors and the circuit sections, and the plurality of extensions may be provided in correspondence to the transmission modules, receiving modules or transmission/receiving modules and may be thermally connected with the corresponding transmission modules, receiving modules or transmission/receiving modules, respectively.

According to a fourth aspect of the invention, there is provided a test board for generating a signal to be fed to an electronic device, having a circuit section for generating the signal, a cooling unit for cooling the circuit section; a connector section for transmitting/receiving signals between the circuit section and outside cables and a heat transferring object for thermally connecting the cooling unit with the connector section, wherein the heat transferring object has a plurality of thermal transferring plates each having elasticity and provided in lamination and adhesive materials having thermal conductivity and provided between the thermal transferring plates to slidably fix the thermal transferring plates.

It is noted that the summary of the invention described above does not necessarily describe all necessary features of the invention. The invention may also be a sub-combination of the features described above.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
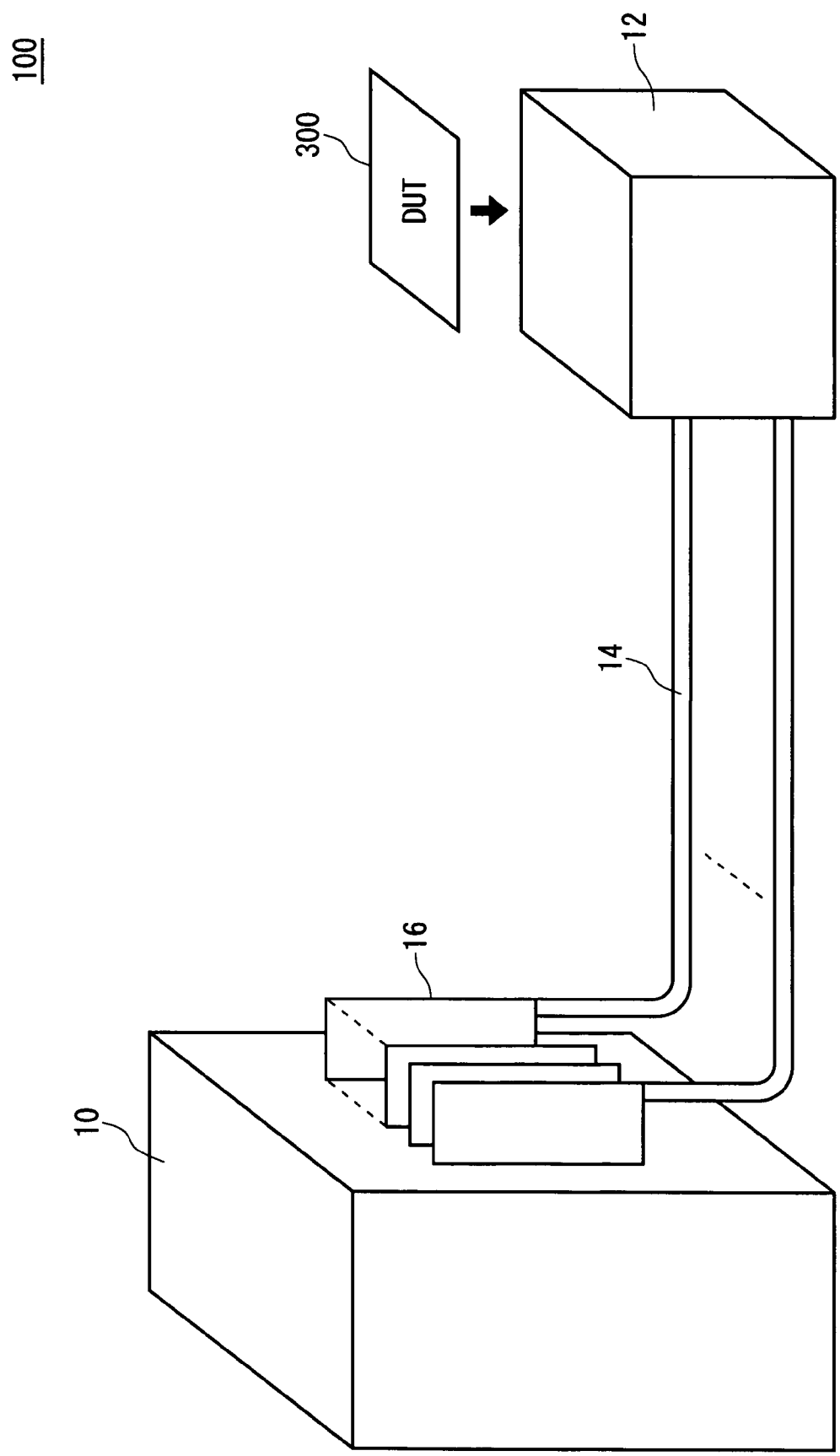
FIG. 1 is a drawing showing one exemplary configuration of a test apparatus according to one embodiment of the invention.

FIG. 1 is a drawing showing one exemplary configuration of a test apparatus according to one embodiment of the invention. The test apparatus 100 for testing an electronic device 300 such as a semiconductor circuit has a main frame 10, a plurality of cable units 16 and a test head 12. Signals are transmitted between the main frame 10 and the test head 12 by using optical cables 14.

The test head 12 mounts the electronic device 300 thereon and transmits/receives signals to/from the electronic device 300. For example, the test head 12 is connected with the main frame 10 through the intermediary of the optical cables 14 and the cable units 16 and applies a test pattern to the electronic device 300 based on a control signal received from the main frame 10. The test head 12 may also transmit/receive the signals to/from a plurality of electronic devices 300.

The main frame 10 generates the control signal and feeds it to the test head 12. The main frame 10 has a plurality of test boards 20 described below with reference to FIG. 2. Each test board 20 generates the control signal corresponding to each function. Each test board 20 is also provided with a plurality of connectors and is connected with the corresponding cable unit 16 through the intermediary of the connector. Each connector is a connector for fiber optic cable in this example.

The plurality of cable units 16 is provided in correspondence to the plurality of test boards 20. One end of each cable unit 16 is connected to the connector of the corresponding test board 20 and the other end is connected to the test head 12. That is, each cable unit 16 optically connects the test board 20 with the test head 12 to transmit the control signal to the test head 12.

Figure 2:
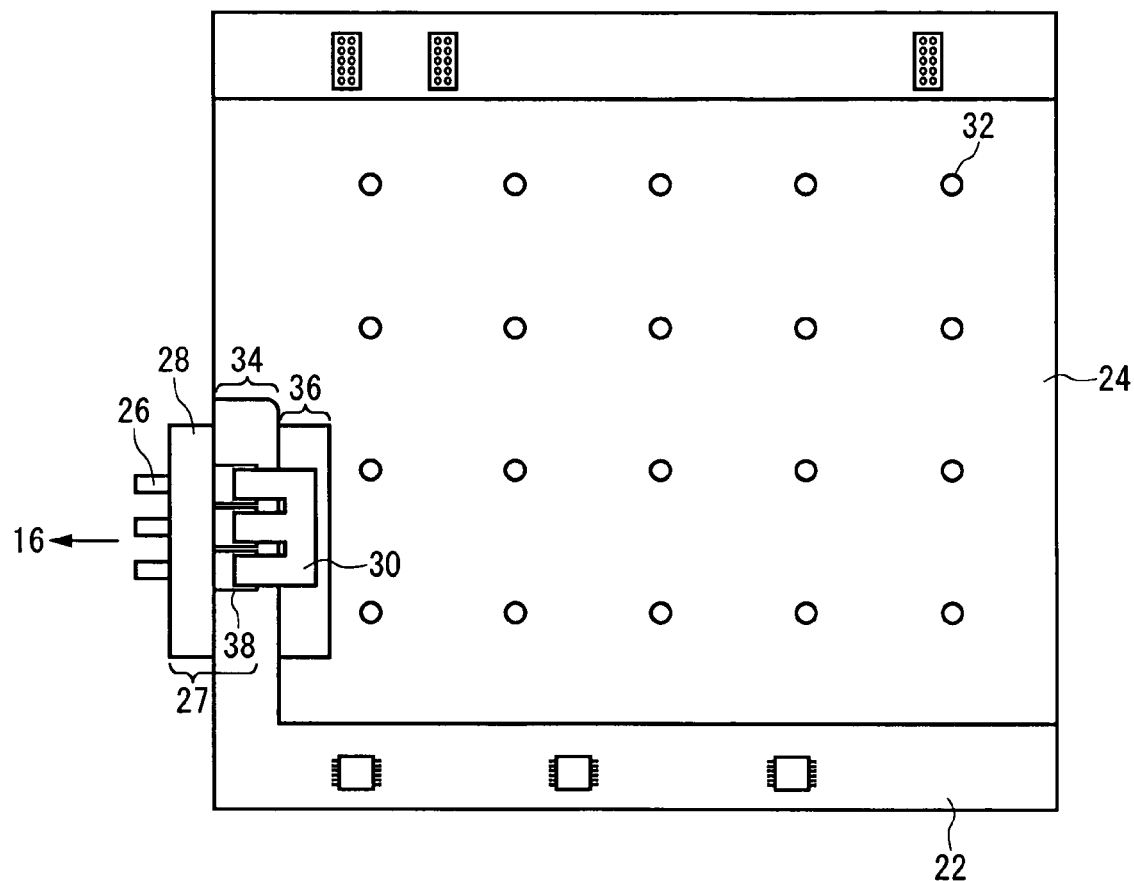
FIG. 2 is a drawing showing one exemplary configuration of a test board.

FIG. 2 is a drawing showing one exemplary configuration of the test board 20. The test board 20 has a circuit board 22, a cooling unit 24, a connector section 27 and a heat transferring object 30. A circuit section (not shown) having integrated circuits and others is formed in the circuit board 22. The circuit section generates signals to be transmitted to the test head 12 and processes signals received from the test head 12. The circuit section also transmits/receives signals to/from the cable unit 16 via the connector 26.

The cooling unit 24 is provided in the circuit board 22 so as to cover at least a part of the circuit section. The cooling unit 24 may be provided so as to cover the whole circuit section or so as to cover an area where calorific power is large within the circuit section. The cooling unit 24 cools the circuit section by refrigerant circulating within for example. The cooling unit 24 is fixed to the surface of the circuit board 22 by screws or the like.

The connector section 27 transmits/receives signals between the circuit section of the test board 20 and the cable unit 16. The connector section 27 has a module 38, the connector 26 connected with the cable unit 16 and a connector holding section 28 for fixing the connector 26 to a side plane of the circuit board 22 and for optically connecting the module 38 with the connector 26. The connector 26 is an optical connector in this example. The module 38 is a transmission module, a receiving module or a transmission and receiving module for transmitting/receiving signals between the connector 26 and the circuit section of the test board 20. An area of the circuit board 22 where the connector section 27 is provided is not covered by the cooling unit 24. That is, an area of the cooling unit 24 corresponding to the area of the circuit board 22 where the connector section 27 is provided may be cut away.

One end of the heat transferring object 30 is connected with the module 38 of the connector section 27 and another end thereof is connected with the cooling unit 24 to transfer heat generated by the module 38 to the cooling unit 24. Here, when level of an upper plane of the cooling unit 24 is higher than that of an upper plane of the module 38, it is preferable to provide an area 36 in the cooling unit 24 for connecting with the heat transferring object 30 on a level close to the surface of the circuit board 22 as compared to the other area. That is, the level of the upper plane of the area 36 is preferable to be lower than that of the upper plane of the other area of the cooling unit 24. For example, the level of the upper plane of the area 36 is almost equal with that of the upper plane of the module 38. Such configuration allows the connector section 27 provided separately from the cooling unit 24 to be cooled.

Figure 3:
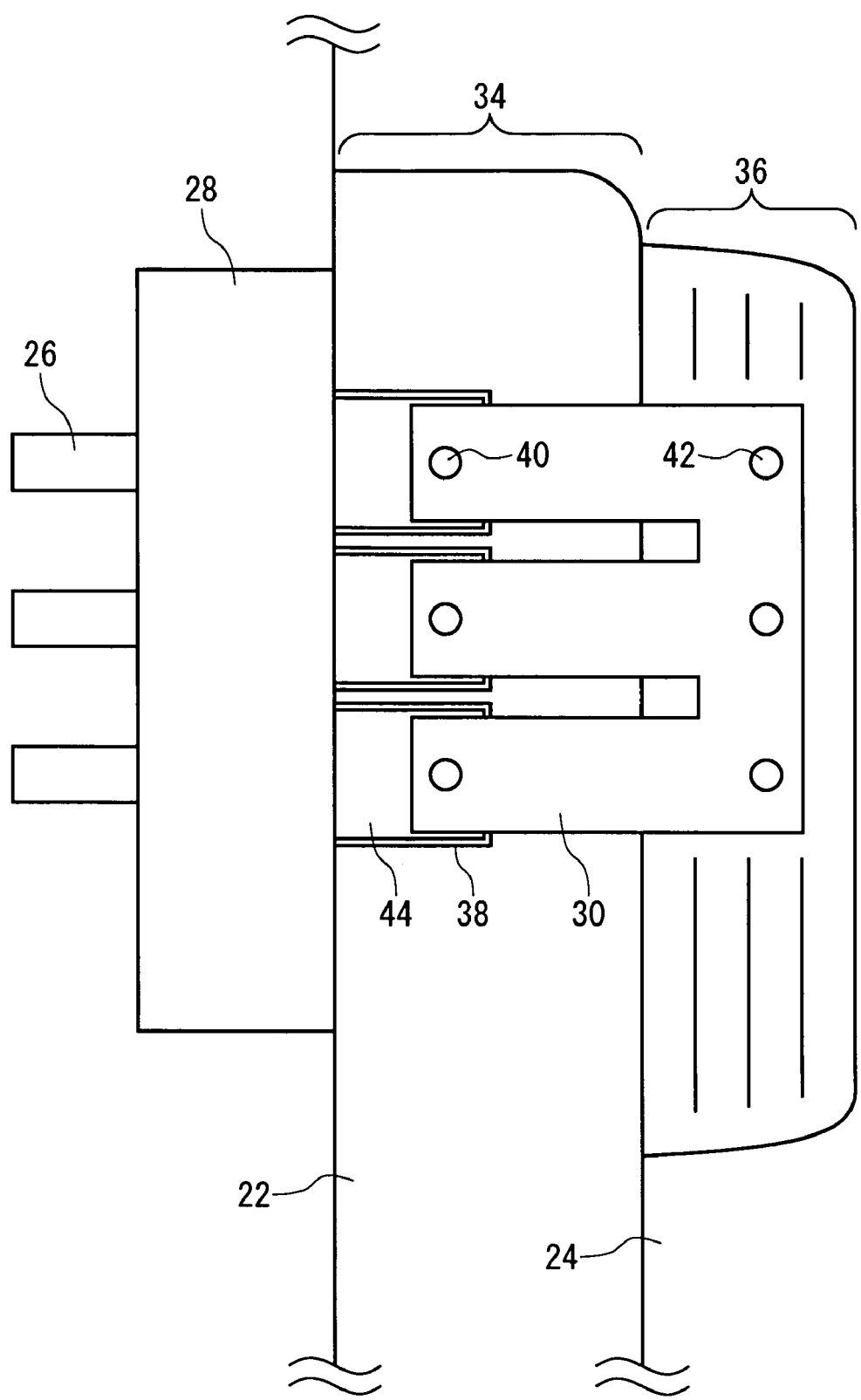
FIG. 3 is an enlarged view of a heat transferring object and its periphery.

FIG. 3 is an enlarged view of the heat transferring object 30 and its periphery. The connector section 27 has the plurality of modules 38 for transmitting/receiving signals between the respective connectors 26 and the circuit section as described before. The module 38 is a circuit containing a light receiving element, a light emitting element, a photo-electric transfer element and the like. Each module 38 is provided in the area 34 of the circuit board 22 not covered by the cooling unit 24.

A metal plate 44 for transferring heat is provided on an upper face of each of the plurality of modules 38. The heat transferring object 30 thermally connects the metal plate 44 provided on each module 38 with the cooling unit 24. The heat transferring object 30 is fixed to the module 38 and the cooling unit 24 by screws 40 and 42. At this time, the screw 40 may fix the heat transferring object 30, the metal plate 44 and the module 38 altogether.

Figure 4:
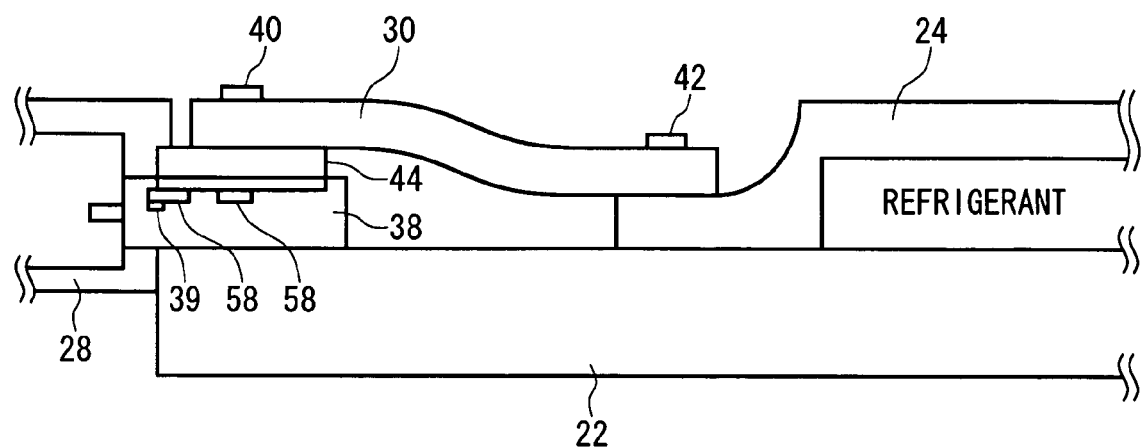
FIG. 4 is a section view of the heat transferring object and its periphery.

FIG. 4 is a section view of the heat transferring object 30 and its periphery. The module 38 in this example is a transmission module and has an integrated circuit 58 and a light emitting element 39. When the module 38 is a receiving module, the module 38 has a light receiving element instead of the light emitting element and when it is a transmitting and receiving module, it has an integrated circuit 58, a light emitting element 39 and a light receiving element. One end of the heat transferring object 30 is secured to the upper plane of the module 38 and the other end is secured to the upper plane of the cooling unit 24 as described before. The integrated circuit 58 and the light emitting element 39 are thermally connected with the end of the heat transferring object 30. Although the level of the planes where the respective ends of the heat transferring object 30 are secured is preferable to be equal in this case, there is a case when the level of the respective planes cannot be equalized due to a problem in design and the like. There is also a case when the level of the upper plane of the cooling unit 24 fluctuates when refrigerant such as cooling water is circulated through the cooling unit 24. The heat transferring object 30 of the present embodiment has a configuration of reducing stress which is generated at the point of connection due to the difference of level, improving the reliability on the connection of the heat transferring object 30. Such configuration allows the exothermic body such as the integrated circuit 58 and the light emitting element 39 in the module 38 to be cooled. Next, the configuration of the heat transferring object 30 will be explained.

Figure 5:
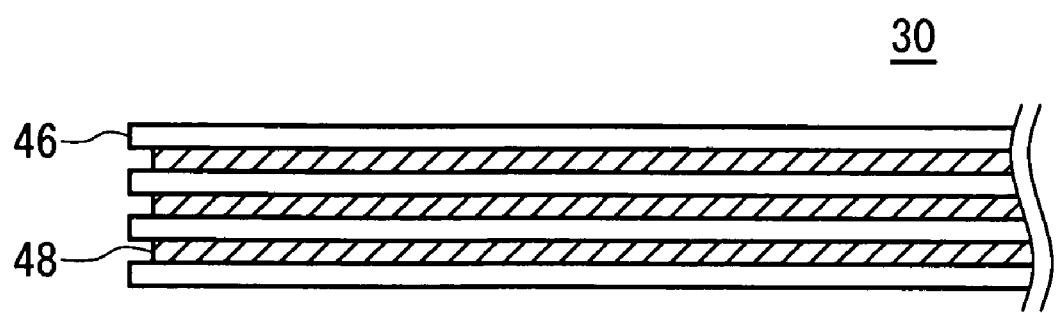
FIG. 5 is an enlarged view of a section of the heat transferring object.

FIG. 5 is an enlarged view of a section of the heat transferring object 30. The heat transferring object 30 has a plurality of thermal transferring plates 46 and adhesive materials 48. Each of the plurality of thermal transferring plates 46 has elasticity and is provided in lamination. The thermal transferring plate 46 may be a metal sheet such as copper which is formed fully thinly so as to have the elasticity.

The adhesive materials 48 are provided between the respective thermal transferring plates 46 so as to slidably hold them. The adhesive material 48 is preferable to have high thermal conductivity. That is, the respective thermal transferring plates 46 are laminated in the vertical direction and are held slidably in the horizontal direction. The adhesive material 48 may be grease into which metal particles having high thermal conductivity are mixed for example.

Such configuration allows the stress applied to the point of connection to be reduced by dispersing the stress by bending the heat transferring object 30 even if there is a difference in the level of the planes where the heat transferring object 30 is secured. That is, when the heat transferring object 30 contacts with the connecting planes of the connector section 27 and the cooling unit 24, the respective thermal transferring plates 46 slide corresponding to the difference of the level between the connecting planes and disperse the stress caused by bending. Then, because the heat transferring object 30 is secured by the screws or the like while sliding the thermal transferring plates 46, it may be secured while reducing the stress applied to the soldered part of the module 38 and the circuit board 22. Accordingly, it is possible to improve the reliability of connection of the soldered part.

Although the adhesive material 48 is applied to the whole thermal transferring plate 46 in FIG. 5, the adhesive material 48 may be applied to a part of the surface of the thermal transferring plate 46 in another embodiment because thermal conductivity of the adhesive material 48 is lower than that of the thermal transferring plate 46 using a copper sheet or the like. It is preferable to apply the adhesive material 48 thinly as much as possible. It is also preferable to make the adhesive material 48 from a non-solidified material. Still more, it is preferable to form the adhesive material 48 so as not diffuse to the outside of the heat transferring object 30.

Figure 6A:
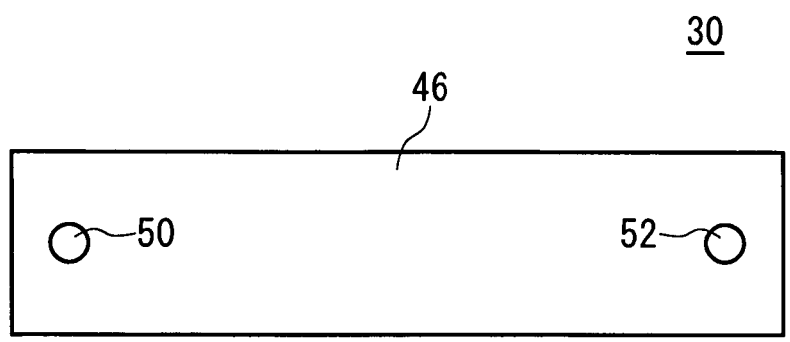
FIGS. 6A and 6B are exemplary plan views of the heat transferring object.
Figure 6B:
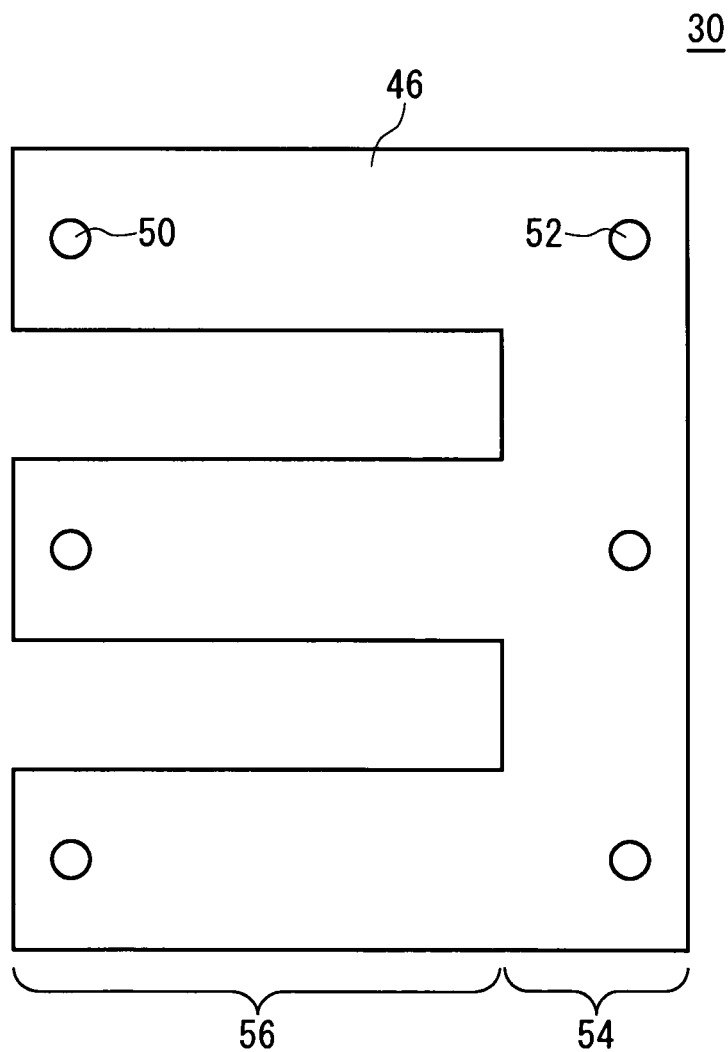

FIGS. 6A and 6B show exemplary plan views of the thermal transferring plate 46 of the heat transferring object 30. As shown in FIG. 6A, the upper plane of the thermal transferring plate 46 may be almost rectangular. The respective thermal transferring plates 46 have almost the same shape, and screw holes 50 and 52 for securing the object to be cooled and the cooling unit are provided at the their respective ends.

Preferably, the screw holes 50 and 52 provided through the respective thermal transferring plates 46 have a shape that enables the plurality of thermal transferring plates 46 to be secured altogether even if the thermal transferring plates 46 slide in the longitudinal direction. For example, a width of the screw holes 50 and 52 in the longitudinal direction may be larger than a width of the screw holes 50 and 52 in a transverse direction of the thermal transferring plates 46.

The thermal transferring plate 46 may also have a cooling unit fixing portion 54 to be secured to the cooling unit 24 and a plurality of extensions 56 to be secured to the plurality of objects to be cooled as shown in FIG. 6B. The plurality of extensions 56 extends respectively from the cooling unit fixing portion 54 separately from each other. That is, the plurality of extensions 56 is provided in a shape of comb. Then, each of the plurality of extensions 56 is secured to the corresponding object to be cooled independently from each other.

Such configuration allows the plurality of objects to be cooled and the cooling unit 24 to be thermally connected altogether. Still more, even if there is a difference in the level of the upper planes of the plurality of objects to be cooled, such configuration can absorb the difference of level because the plurality of extensions 56 is provided separately. For example, as shown in FIG. 3, the plurality of extensions 56 is provided in correspondence to the plurality of modules 38 of the connector section 27 and is thermally connected with the corresponding module 38, respectively.

Although the invention has been described by way of the exemplary embodiments, it should be understood that those skilled in the art might make many changes and substitutions without departing from the spirit and scope of the invention.

It is obvious from the definition of the appended claims that the embodiments with such modifications also belong to the scope of the invention.

For example, although the heat transferring object 30 in FIG. 3 is used to thermally connect the circuit section in the test board 20 with the connector section 27, the heat transferring object 30 may be used in another place of the test apparatus 100. That is, while the test apparatus 100 has a plurality of circuit sections driven for testing an electronic device, cables for connecting those circuit sections, connector sections for connecting the respective circuit sections with the cables and a cooling unit for cooling at least a part of the plurality of circuit sections, the heat transferring object 30 may thermally connect the cooling unit with the connector sections provided in correspondence to the circuit sections to be cooled by the cooling unit. For example, the heat transferring object 30 may be used in the test head 12.

As it is apparent from the above description, the invention can provide the thermal transferring plates improving the reliability on the connection of the cooling unit and the object to be cooled.

What is claimed is:

1. A heat transferring object for transferring heat generated by a plurality of objects to be cooled to a cooling unit, comprising:
   a plurality of thermal transferring plates each having elasticity and provided in lamination; and
   adhesive materials having thermal conductivity and provided between said thermal transferring plates so as to slidably hold said thermal transferring plates
   wherein each of said thermal transferring plates has:
      a cooling unit fixing portion to be secured to said cooling unit; and
      a plurality of extensions extending respectively from said cooling unit fixing portion and secured to said objects to be cooled independently from each other.

2. The heat transferring object as set forth in claim 1, wherein each of said thermal transferring plates has almost the same shape.

3. A test apparatus for testing an electronic device, comprising:
   a plurality of circuit sections to be driven to test said electronic device;
   cables for connecting one of said circuit sections with said electronic device;
   connector sections for connecting each of said circuit sections with one of said cables;
   a cooling unit for cooling at least a part of said plurality of circuit sections; and
   a heat transferring object for thermally connecting said cooling unit with one of said connector sections provided in correspondence to said circuit section to be cooled by said cooling unit;
   wherein said heat transferring object has
      a plurality of thermal transferring plates each having elasticity and provided in lamination; and
      adhesive materials having thermal conductivity and provided between said thermal transferring plates so as to slidably hold said thermal transferring plates,
   wherein each of said thermal transferring plates has:
      a cooling unit fixing portion to be secured to said cooling unit; and
      a plurality of extensions extending respectively from said cooling unit fixing portion and secured to said objects to be cooled independently from each other.

4. A test apparatus for testing an electronic device, comprising:
   a test head for transmitting/receiving signals to/from said electronic device;
   a test board for generating and feeding a test signal to be fed to said electronic device; and
   a cable for connecting said test head with said test board;
   wherein said test board has a circuit section for generating said test signal;
   a cooling unit for cooling said circuit section;
   a connector section for transmitting/receiving signals between said circuit section and said cable; and
   a heat transferring object for thermally connecting said cooling unit with said connector section; said heat transferring object has
      a plurality of thermal transferring plates each having elasticity and provided in lamination; and
      adhesive materials having thermal conductivity and provided between said thermal transferring plates to slidably fix said thermal transferring plates.

5. The test apparatus as set forth in claim 4, wherein said cable is an optical cable for optically connecting said test head with said test board;
   said cooling unit covers and cools said circuit section by means of cooling fluid circulating therein;
   said connector section is provided on the outside of an area covered by said cooling unit and optically connects said circuit section with said cable; and
   said heat transferring object thermally connects said cooling unit with said connector section.

6. The test apparatus as set forth in claim 4, wherein each of said thermal transferring plates has almost the same shape.

7. The test apparatus as set forth in claim 5, wherein each thermal transferring plate has a cooling unit fixing portion to be secured to said cooling unit and
   a plurality of extensions extended respectively from said cooling unit fixing portion to be secured to said connector sections independently from each other.

8. The test apparatus as set forth in claim 7, wherein said connector section has
   a plurality of optical connectors connected to said cables; and
   a plurality of transmission modules, receiving modules or transmission/receiving modules for transmitting/receiving signals between said plurality of optical connectors and said circuit sections; and
   said plurality of extensions is provided in correspondence to said transmission modules, receiving modules or transmission/receiving modules and is thermally connected with said corresponding transmission modules, receiving modules or transmission/receiving modules, respectively.

9. A test board for generating a signal to be fed to an electronic device, comprising:
   a circuit section for generating said signal;
   a cooling unit for cooling said circuit section;
   connector sections for transmitting/receiving signals between said circuit section and outside cables; and
   a heat transferring object for thermally connecting said cooling unit with said connector sections; said heat transferring object has
      a plurality of thermal transferring plates each having elasticity and provided in lamination; and adhesive materials having thermal conductivity and provided between said thermal transferring plates to slidably fix said thermal transferring plates,
wherein each of said thermal transferring plates has:
a cooling unit fixing portion to be secured to said cooling unit; and
a plurality of extensions extending respectively from said cooling unit fixing portion and secured to said objects to be cooled independently from each other.

* * * * *

UNITED STATES PATENT AND TRADEMARK OFFICE
CERTIFICATE OF CORRECTION

PATENT NO.       : 7,307,438 B2
APPLICATION NO.  : 11/217128
DATED            : December 11, 2007
INVENTOR(S)      : Atsushi Ono et al.

It is certified that error appears in the above-identified patent and that said Letters Patent is hereby corrected as shown below:

In the Claims:

In Claim 1, column 7, line 34, after the word "plates" a --,-- should be added.

Signed and Sealed this

Twenty-second Day of July, 2008

JON W. DUDAS
*Director of the United States Patent and Trademark Office*